(12) United States Patent
Lenchenkov

(10) Patent No.: US 8,716,823 B2
(45) Date of Patent: May 6, 2014

(54) BACKSIDE IMAGE SENSOR PIXEL WITH SILICON MICROLENSES AND METAL REFLECTOR

(75) Inventor: Victor Lenchenkov, Sunnyvale, CA (US)

(73) Assignee: Aptina Imaging Corporation, George Town (KY)

( * ) Notice: Subject to any disclaimer, the term of this patent is extended or adjusted under 35 U.S.C. 154(b) by 0 days.

(21) Appl. No.: 13/481,589

(22) Filed: May 25, 2012

(65) Prior Publication Data

US 2013/0134535 A1 May 30, 2013

Related U.S. Application Data

(60) Provisional application No. 61/557,342, filed on Nov. 8, 2011.

(51) Int. Cl.
*H01L 31/0232* (2006.01)

(52) U.S. Cl.
USPC .......................................................... 257/432

(58) Field of Classification Search
USPC .......................................................... 257/432
See application file for complete search history.

(56) References Cited

U.S. PATENT DOCUMENTS

| | | | |
|---|---|---|---|
| 5,691,548 A * | 11/1997 | Akio | 257/232 |
| 7,704,778 B2 | 4/2010 | Kao et al. | |
| 2005/0056901 A1 | 3/2005 | Kuriyama | |
| 2006/0023313 A1 | 2/2006 | Kim | |
| 2006/0068586 A1 * | 3/2006 | Pain | 438/643 |
| 2006/0148159 A1 * | 7/2006 | Seo et al. | 438/199 |
| 2006/0189024 A1 | 8/2006 | Kao et al. | |
| 2008/0023738 A1 * | 1/2008 | Lenchenkov | 257/294 |
| 2008/0258187 A1 | 10/2008 | Ladd et al. | |
| 2009/0250594 A1 | 10/2009 | Tanaka et al. | |
| 2010/0164040 A1 | 7/2010 | Kao et al. | |
| 2013/0069188 A1 * | 3/2013 | Chen et al. | 257/432 |

FOREIGN PATENT DOCUMENTS

KR 10-2008-0097709 11/2008
KR 10-2011-0059807 6/2011

* cited by examiner

*Primary Examiner* — Anthony Ho
(74) *Attorney, Agent, or Firm* — Treyz Law Group; Jason Tsai

(57) ABSTRACT

A backside illumination (BSI) image sensor pixel that includes microlenses with elevated refractive indices is provided. The image sensor pixel may include a photodiode formed in a silicon substrate, a first microlens formed in a back surface of the substrate, a second microlens formed over a front surface of the substrate, a dielectric stack formed on the front surface of the substrate, and a reflective structure formed in the dielectric stack above the second microlens. The first microlens may be fabricated by forming shallow trench isolation structures in the back surface. The second microlens may be fabricated by depositing polysilicon on the front substrate of the substrate. The first microlens may serve to concentrate light towards the photodiode, whereas the second microlens may serve to collimate light that traverses through the substrate so that light exiting the second microlens will reflect off the reflective structure and back into the photodiode.

18 Claims, 7 Drawing Sheets

US 8,716,823 B2

BACKSIDE IMAGE SENSOR PIXEL WITH SILICON MICROLENSES AND METAL REFLECTOR

This application claims the benefit of provisional patent application No. 61/557,342, filed Nov. 8, 2011, which is hereby incorporated by reference herein in its entirety.

BACKGROUND

This relates generally to image sensors, and more specifically, to backside illumination image sensors.

Image sensors are commonly used in electronic devices such as cellular telephones, cameras, and computers to capture images. Conventional image sensors are fabricated on a semiconductor substrate using complementary metal-oxide-semiconductor (CMOS) technology or charge-coupled device (CCD) technology. The image sensors may include photodiodes and other operational circuitry such as transistors formed in a front surface of the substrate. A dielectric stack is formed on the front surface of the substrate directly on top of the photodiodes. The dielectric stack includes metal routing lines and metal vias formed in dielectric material. Light guides are often formed in the dielectric stack to guide the trajectory of incoming light.

A color filter array is formed over the dielectric stack to provide each pixel with sensitivity to a certain range of wavelengths. Microlenses may be formed over the color filter array. Light enters from a front side of the image sensor (i.e., light enters the microlenses and travels through the color filters into the dielectric stack). An image sensor used in this way is referred to as a frontside illumination (FSI) image sensor.

It is desired to use the light guides to direct the incoming light into the photodiodes. The incoming light, however, is sometimes reflected and absorbed by the metal routing lines and vias when traversing the dielectric stack. This results in undesirable pixel crosstalk and signal degradation.

To address these issues, backside illumination image sensors have been developed. These sensors are, however, also subject to crosstalk due to light scattering from metal routing lines and vias.

It would therefore be desirable to be able to provide image sensors with improved performance.

DETAILED DESCRIPTION

Digital camera modules are widely used in electronic devices such as digital cameras, computers, cellular telephones, or other electronic devices. These electronic devices may include image sensors that receive incoming light to capture an image. The image sensors may include arrays of image sensor pixels. The pixels in the image sensors may include photosensitive elements such as photodiodes that convert the incoming light into digital data. Image sensors may have any number of pixels (e.g., hundreds or thousands or more). A typical image sensor may, for example, have millions of pixels (e.g., megapixels). In high-end equipment, image sensors with ten megapixels or more are not uncommon.

Figure 1:
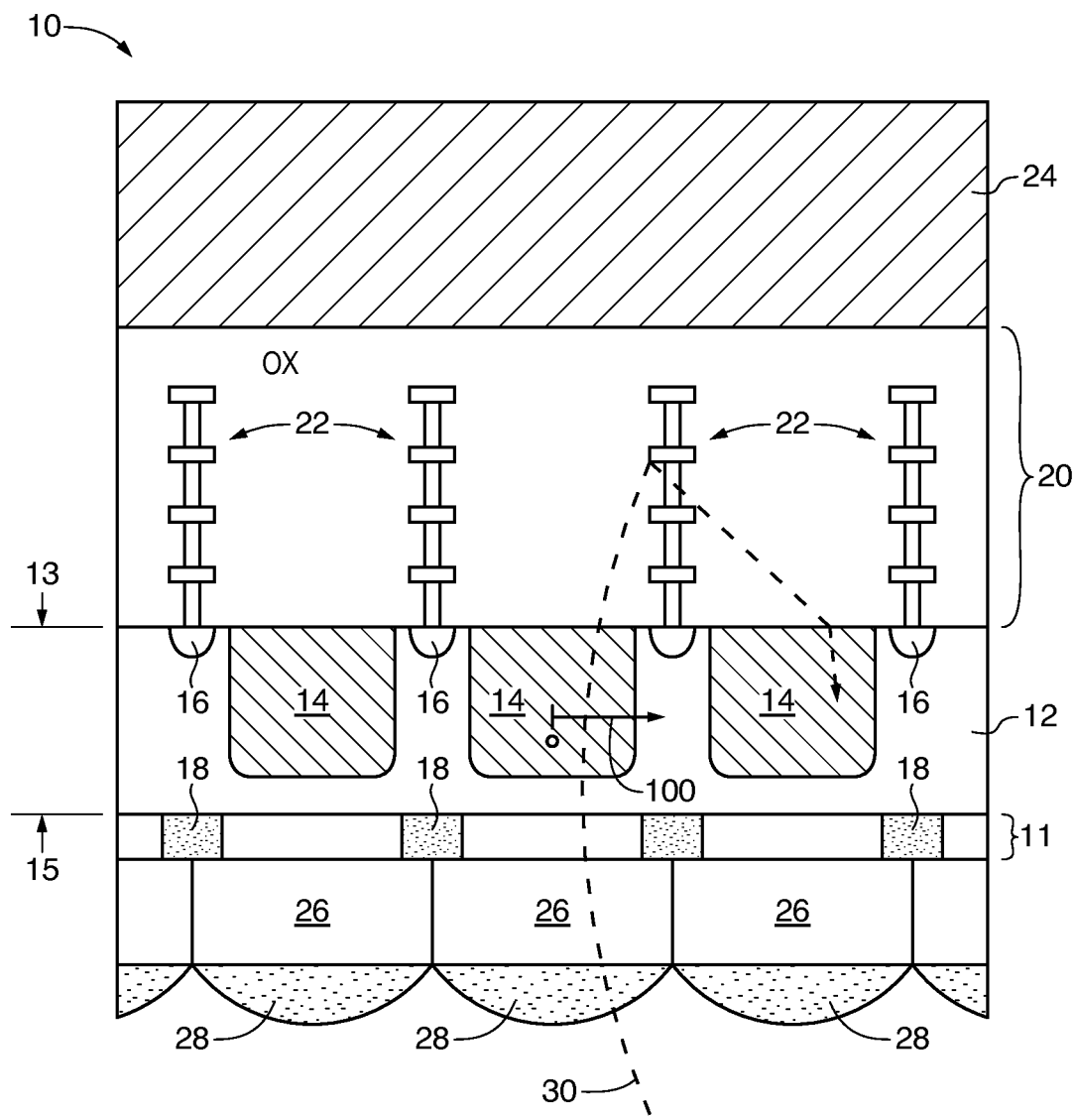
FIG. 1 is a cross-sectional side view of a conventional backside illumination image pixel array.

FIG. 1 is a cross-sectional side view of an image pixel array 10. Pixel array 10 includes conventional backside illumination image sensor pixels arranged in an array. Each pixel has a photodiode 14 formed in a front side of p-type epitaxial silicon substrate 12. Each pixel also has an associated floating diffusion region 16 formed in the front side of substrate 12.

A dielectric stack 20 is formed on front surface 13 of substrate 12. Dielectric stack 20 includes metal interconnect structures 22 formed in dielectric material (e.g., silicon dioxide). A silicon carrier board 24 is formed on dielectric stack 20.

A color filter array 26 is formed on back surface 15 of substrate 12. A respective microlens 28 covers each color filter pixel element 26. Each pixel has a metal light ring 18 formed on the back surface of substrate 12 in a dielectric layer 11. Metal light ring 18 lines the perimeter of each color filter 26 and serves as a light block to prevent pixel crosstalk.

Light can enter from the back side of the image sensor pixels through microlenses 28. The incoming light is partially absorbed by photodiode 14. The remaining portion of the incoming light penetrates through substrate 12 into dielectric stack 20. The remaining portion of the incoming light may reflect off interconnect structures 22 and may be absorbed in an adjacent photodiode 14, resulting in pixel crosstalk (see, e.g., the dotted trajectory 30 of the incoming light in FIG. 1).

Figure 2:
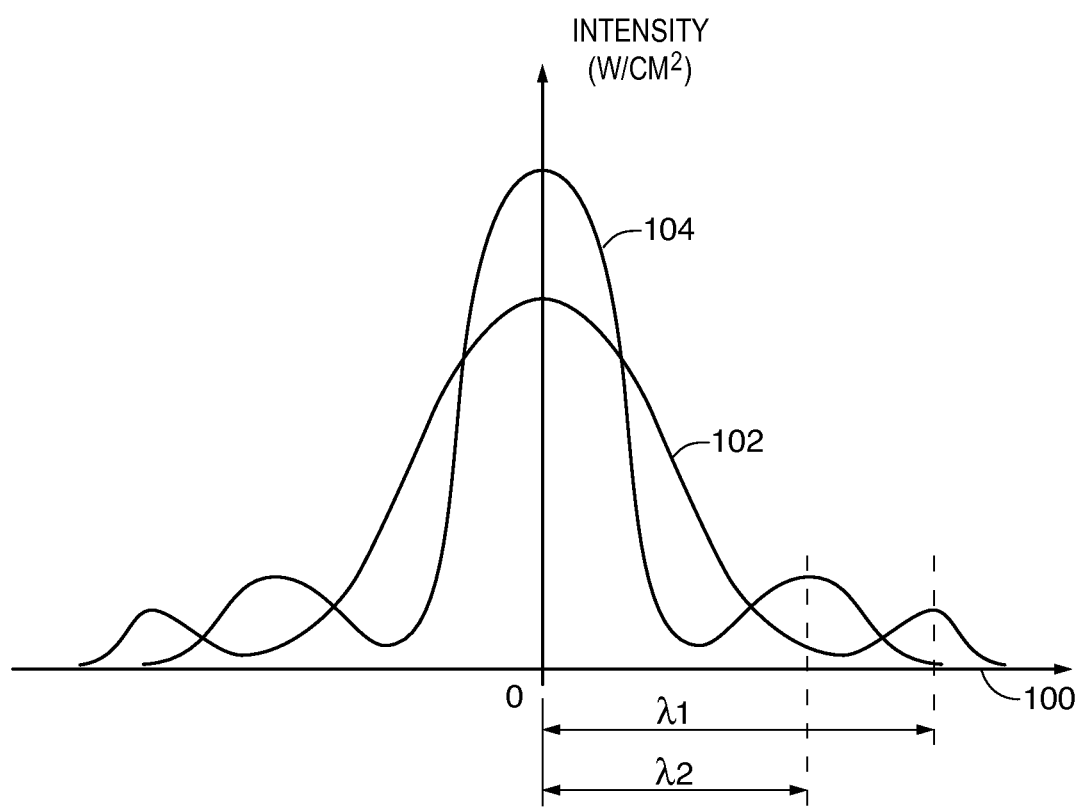
FIG. 2 is plot showing diffraction profiles associated with microlenses having different refractive indices in accordance with an embodiment of the present invention.

Microlens 28 in conventional backside illumination image sensor pixel 10 of FIG. 1 is typically formed from polymer having a refractive index of 1.6 or less. FIG. 2 is a plot showing light diffraction profiles that is taken along cross-sectional line 100 in FIG. 1. In the example of FIG. 2, curve 102 may correspond to a first diffraction profile that is generated using a first microlens (i.e., microlens 28 of FIG. 1) with a refractive index of 1.6, whereas curve 104 may correspond to a second diffraction profile that is generated using a second microlens with a higher refractive index of 4.

In general, the wavelength of light in particular material is inversely proportional to the index of refraction of that material. Light entering the first microlens with the lower refractive index will therefore exhibit a wavelength λ1 that is greater than wavelength λ2 associated with light entering the second microlens with a relatively higher refractive index. Incoming light entering a photodiode of an image sensor pixel may be better absorbed if the wavelength of the incoming light is shorter and if the diffraction profile of the incoming light is more narrow (i.e., the light is focused at greater intensity levels near the center of the photodiode). It may therefore be desirable to form microlenses with greater refractive indices to provide image sensor pixels with enhanced efficiency and reduced cross-talk.

Figure 3:
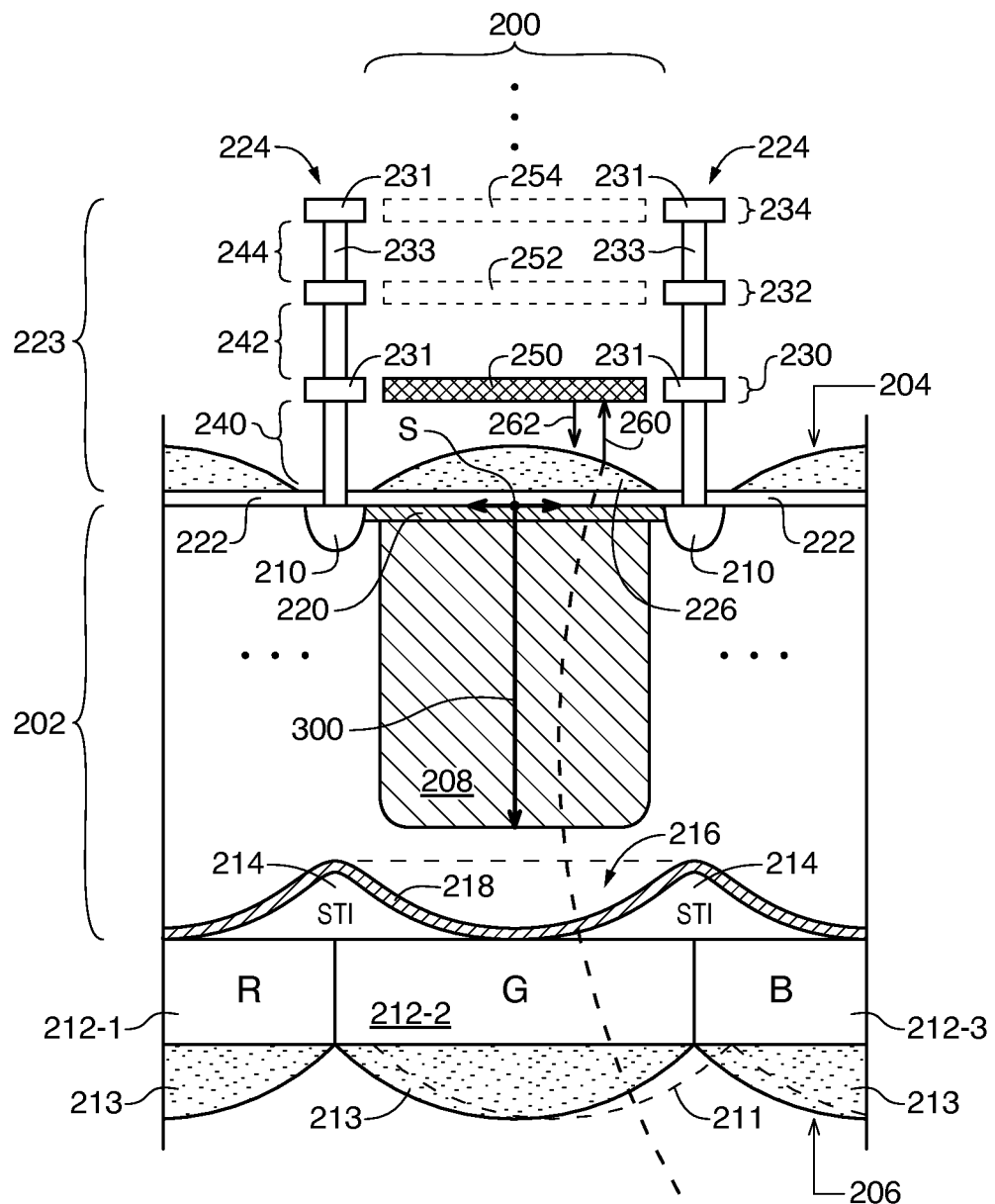
FIG. 3 is a cross-sectional side view of a backside illumination image sensor pixel with a backside silicon focusing microlens and a frontside polysilicon collimating microlens in accordance with an embodiment of the present invention.

FIG. 3 is a diagram of an illustrative image sensor pixel 200 that may exhibit enhanced efficiency and reduced crosstalk. Image sensor pixel 200 may be formed in a p-type silicon substrate 202 sometimes referred to as an epitaxial silicon substrate. Substrate 202 may have a front side 204 and a back side 206. Any process that is performed from front side 204 may be referred to as a frontside process while any process that is performed from back side 206 may be referred to as a back side process.

Structures such as photodiodes and associated transistors (e.g., charge transfer transistors, reset transistors, source follower transistors, address transistors, etc.) may be formed in a front surface of substrate 202. A dielectric stack that includes alternating layers of metal routing layers and conductive via layers may be formed on the front surface of substrate 202. In some embodiments, a first set of microlenses and reflective structures may be formed over the front surface of substrate 202.

A second set of microlenses may be formed in a back surface of substrate 202. Color filters may be placed on the back surface of substrate 202. Incoming light may be filtered by the color filters, may enter substrate 202 via back side 206, may be focused towards respective photodiodes using the second set of microlenses, may be partially absorbed by each photodiode, may be collimated by the first set of microlenses, and may be reflected back towards the photodiodes by the reflective structures. Image sensors having image sensor pixels configured in this way may sometimes be referred to as backside illumination (BSI) image sensors, because light enters from the back side of the image sensors (e.g., incoming light enters substrate 202 through its back surface).

As shown in FIG. 3, substrate 202 may include structures such as photodiode 208, diffusion regions for transistors, and other circuitry formed in its front surface. For example, photodiode 208 may have an n-type doping region that is formed by implanting n-type dopants from the front side of substrate 202.

Figure 4:
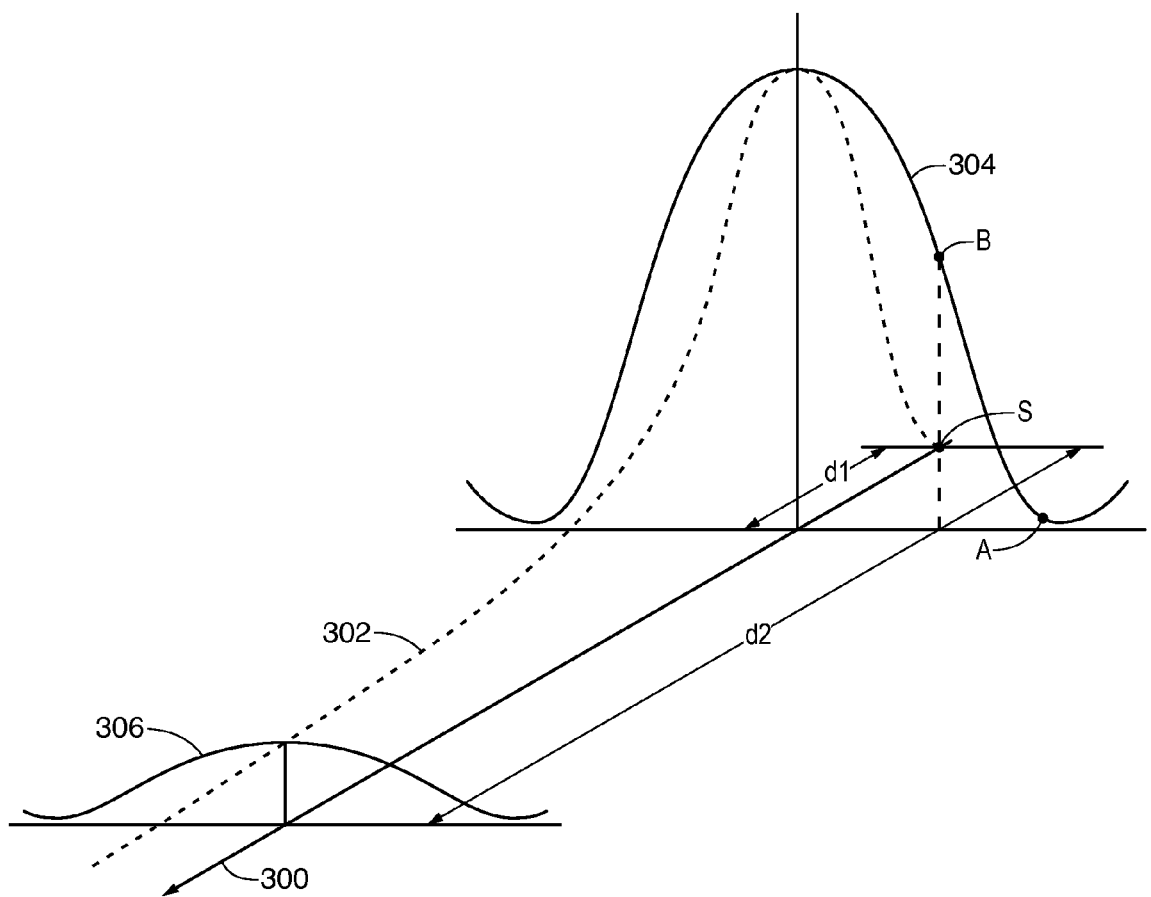
FIG. 4 is a potential profile associated with a substrate of a backside illumination image sensor pixel in accordance with an embodiment of the present invention.

FIG. 4 is a diagram showing an illustrative potential profile associated with substrate 202 taken along line 300 of FIG. 3. The potential profile of substrate 202 may be directly based on the dopant characteristics of substrate 202. As shown by curve 302 in FIG. 4, energy potential may be substantially higher near front surface S of substrate 202 and may gradually taper down towards regions further away from surface S. This type of potential profile may be a result of implanting n-type dopants from the front surface of substrate 202.

Curve 304 shows a cross-sectional potential profile along a first horizontal plane that is located at a depth d1 from front surface S, whereas curve 206 shows a cross-sectional potential profile along a second horizontal plane that is located at a depth d2 from front surface S. Curve 304 may have a potential peak that is greater than the potential peak of curve 306.

Incoming light may generate charge at various locations within substrate 202. Consider a simplified scenario in which a first electron is generated at location A and a second electron is generated at location B. Points A and B may be located at the same depth d1 within substrate 202 but point A is closer to the center of photodiode 208, whereas point B is further from the center of photodiode 208 (i.e., point B is closer to an adjacent photodiode). The electron that is generated closer to the potential peak (at location B) will more than likely be absorbed by photodiode 208, whereas the electron that is generated near the potential trough (at location A) may accidentally be swept into a neighboring photodiode, resulting in undesired pixel crosstalk. The use of microlenses with enhanced refractive indices can help focus light in a tighter beam that is more concentrated near the center of photodiode 208 (e.g., so that more charge will be generated near location B as opposed to location A).

A dielectric stack 223 may be formed on the front surface of substrate 202 (FIG. 3). Dielectric stack 202 may include layers of silicon oxide or other dielectrics within which conductive structures are formed. Dielectric stack 223 may include alternating layers of metal interconnect layers (also sometimes referred to as metal layers or metal routing layers) and via layers. The metal routing layers may include metal routing lines (also sometimes referred to as interconnects). The via layers may contain vertical conducting structures (e.g., conductive vias such as tungsten vias or other metal vias). If desired, metal may be omitted from a portion of a metal layer or via layer (e.g., to form a region of uninterrupted dielectric).

Dielectric stack 223 may include interconnect structures 224 (e.g., metal routing lines and vias). Interconnect structures 224 may be electrically connected to each image sensor pixel (e.g., to the gates and/or diffusion regions associated with transistors in each image sensor pixel) and to terminals of the other circuits formed in the front surface of substrate 38.

Substrate 202 may include floating diffusion (FD) regions 210 formed in its front surface. Floating diffusion regions may be n+ doped regions (as an example). Interconnect structures 224 formed in dielectric stack 223 may be electrically connected to FD regions 210. Structures 224 may include conductive lines 231 connected through vias 233. For example, metal lines 231 may be formed in a first metal routing layer 230, a second metal routing layer 232, and a third metal routing layer 234, as shown in FIG. 3. Metal vias 233 may be formed in via (or contact) layers 240, 242, and 244. Dielectric stack 223 may have more than three metal layers, if desired.

A color filter array having color filters 212 may be formed on the back surface of substrate 202. Each color filter 212 may serve to filter incoming light for a respective photodiode 208. Color filters 212 may include green filters, red filters, blue filters, yellow filters, cyan filters, magenta filters, or other types of filters. As an example, a green filter passes green light (e.g., light with wavelengths from 495 nm to 570 nm) and reflects and/or absorbs light out of that range (e.g., the green filter reflects red light and blue light). In the example of FIG. 3, color filter 212-1 may be a red filter configured to pass red light through to a first corresponding photodiode, color filter 212-2 may be a green filter configured to pass green light through to a second corresponding photodiode, and color filter 212-3 may be a blue filter configured to pass blue light through to a third corresponding photodiode.

An example of a color filter array pattern that may be used is the GRBG (green-red-blue-green) Bayer pattern. In this type of configuration, the color filter array is arranged into groups of four color filters. In each group, two of the four color filters are green filters, one of the four color filters is a red filter, and the remaining color filter is a blue filter. If desired, other color filter array patterns may be used.

To accommodate incident light at non-zero angles due to either F# camera lens (marginal rays) or non-zero chief ray angles (CRA), unshifted (for F#) and shifted (for non-zero CRA) polymer lenses with a refractive index of approximately 1.6 also can be used in combination with the higher index microlenses described herein. As shown in FIG. 3, unshifted polymer lens 213 may be formed over the color filters. If desired, shifted polymer lens may be used instead of the unshifted polymer lens (as shown by outline 211).

A microlens such as microlens 216 may be formed in the back surface of substrate 202. Microlens 216 may be fabricated by forming surrounding shallow trench isolation (STI) structures 214 in the back surface of substrate 202. The STI trenches 214 defining the shape of built-in silicon lens 216 can be formed by either etching or oxidative shape transfer into substrate 202 in a way such that microlens 216 will achieve the desired radius of curvature (RoC) and/or shape. Microlens 216 may be formed as an integral part of substrate 202 and may therefore be formed from epitaxial silicon. Microlens 216 that is continuous with substrate 202 may sometimes be referred to as a built-in silicon microlens. Epitaxial silicon may have a refractive index of 4 that is greater than that of conventional microlenses and may therefore provide pixel 200 with enhanced light focusing capabilities. Microlens 216 may serve to concentrate incoming light onto associated photodiode 208 and may therefore sometimes be referred to herein as a focusing microlens.

Shallow trench isolation structures 214 may be filled with dielectric material such as silicon dioxide. If desired, a passivation such as p+ doped layer 218 may be formed lining the interface between substrate 202 and the silicon dioxide material in structures 214 to reduce dark current. Each pixel 200 may have a respective backside microlens 216 formed in this way. Shallow trench isolation structures 214 separating neighboring microlenses 216 may also provide electrical isolation and can help reduce pixel crosstalk among adjacent pixels 200.

Pixel 200 may include another microlens such as microlens 226 formed on the front surface of substrate 202. Microlens 226 may be formed by depositing polysilicon on the front surface of substrate 202 and patterning the polysilicon to exhibit the desired radius of curvature (as an example). Polysilicon may have a refractive index of 4. If desired, microlens 226 may be formed using other suitable materials with a refractive index that is greater than 1.6, greater than 3, greater than 4, greater than 5, etc.

A layer of dielectric material such as silicon oxide layer 222 may be interposed between microlens 226 and the front surface of substrate 202. Layer 202 is sometimes referred to as a gate oxide layer. If desired, a passivation layer such as p+ doped layer 220 may be formed at the front surface of substrate 202 separating epitaxial silicon from layer 222 to minimize dark current generation. Each pixel 200 may have a respective frontside microlens 226 formed in this way.

Microlens 226 may serve to collimate light that has traverse through substrate 202 (e.g., so that light exiting the front surface of substrate 202 via microlens 226 travels in a direction 260 that is perpendicular to the front surface of substrate 202) and may therefore sometimes be referred to herein as a collimating microlens.

A reflective structure such as structure 250 may be formed in the first metal layer 230 of dielectric stack 223. Structure 250 may, for example, be a conductive plate configured to reflect the collimated light exiting microlens 226 back towards photodiode 208 (as indicated by arrow 262). If desired, structure 250 may be formed using metal (e.g., aluminum, copper, gold, or silver) or other suitable reflective materials. Reflecting light back towards photodiode 208 in this way reduces crosstalk and enhances signal-to-noise ratio. In other suitable arrangements, reflective structure 250 may be formed in second metal routing layer 232 (at position 252), in third metal routing layer 234 (at position 254), or higher metal routing layers.

The arrangement of FIG. 3 in which BSI image sensor pixel 200 has a backside focusing microlens formed using STI structures 214 and a frontside collimating microlens formed using polysilicon is merely illustrate and does not serve to limit the scope of the present invention. If desired, the backside focusing microlens may be formed on top of the back surface of substrate 202 using materials with suitably high refractive indices while the frontside collimating microlens may be constructed in the front surface of substrate 202 as a built-in microlens by forming surrounding shallow trench isolation structures. In some embodiments in which photodiode 208 is capable of absorbing a sufficient amount of incoming light traversing through substrate 202, collimating lens 226 and reflective structure 250 need not be formed.

Figure 5:
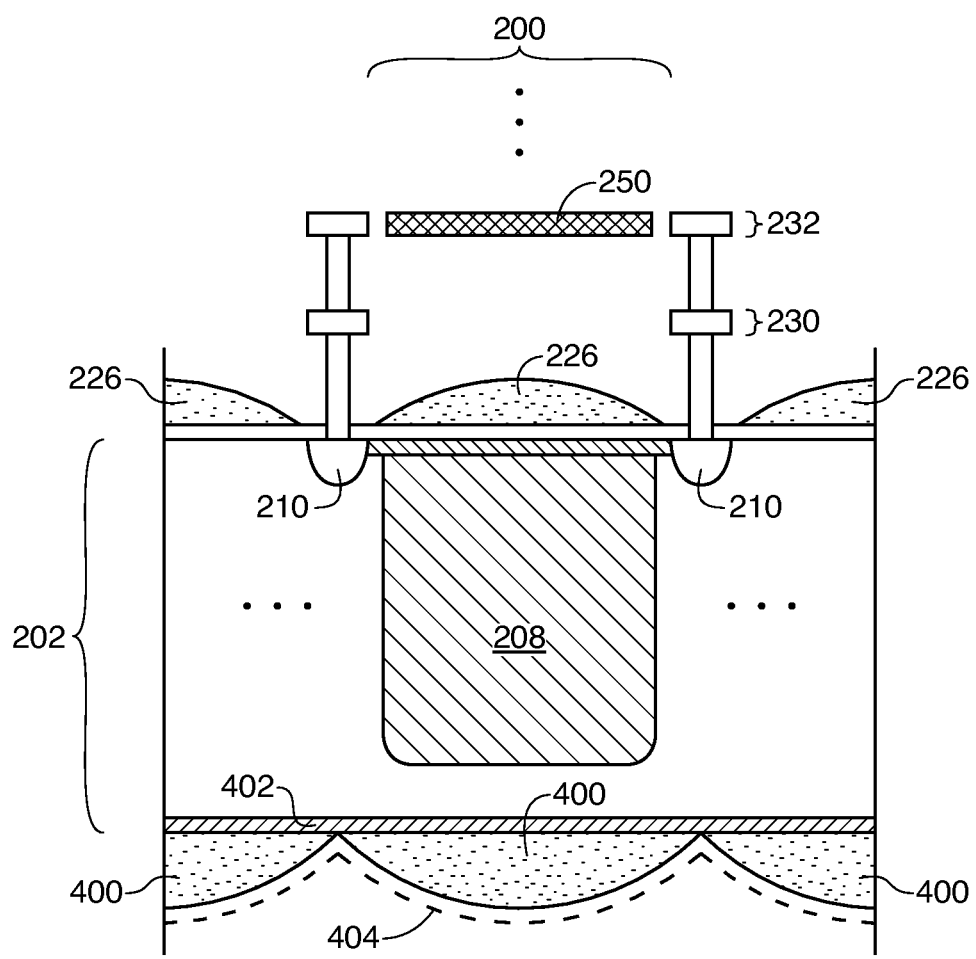
FIG. 5 is a cross-sectional side view off backside illumination image sensor pixel with a backside polysilicon focusing microlens and a frontside polysilicon collimating microlens in accordance with an embodiment of the present invention.

In another suitable arrangement, pixel 200 may include a backside focusing microlens 400 that is formed on top of the back surface of substrate 202 using polysilicon and a frontside collimating microlens 226 that is formed on top of the front surface of substrate 202 using polysilicon (see, e.g., FIG. 5). A passivation layer such as layer 402 may be formed in the back surface of substrate 202 so that layer 402 is interposed between microlens 400 and p-type substrate 202. If desired, this passivation layer may instead be formed over microlens 400 along its curved surface, as indicated by outline 404. Incoming light may be filtered using a color filter array (not shown) before entering microlens 400. In the example of FIG. 5, reflective structure 250 is formed in the second metal routing layer 232.

Figure 6:
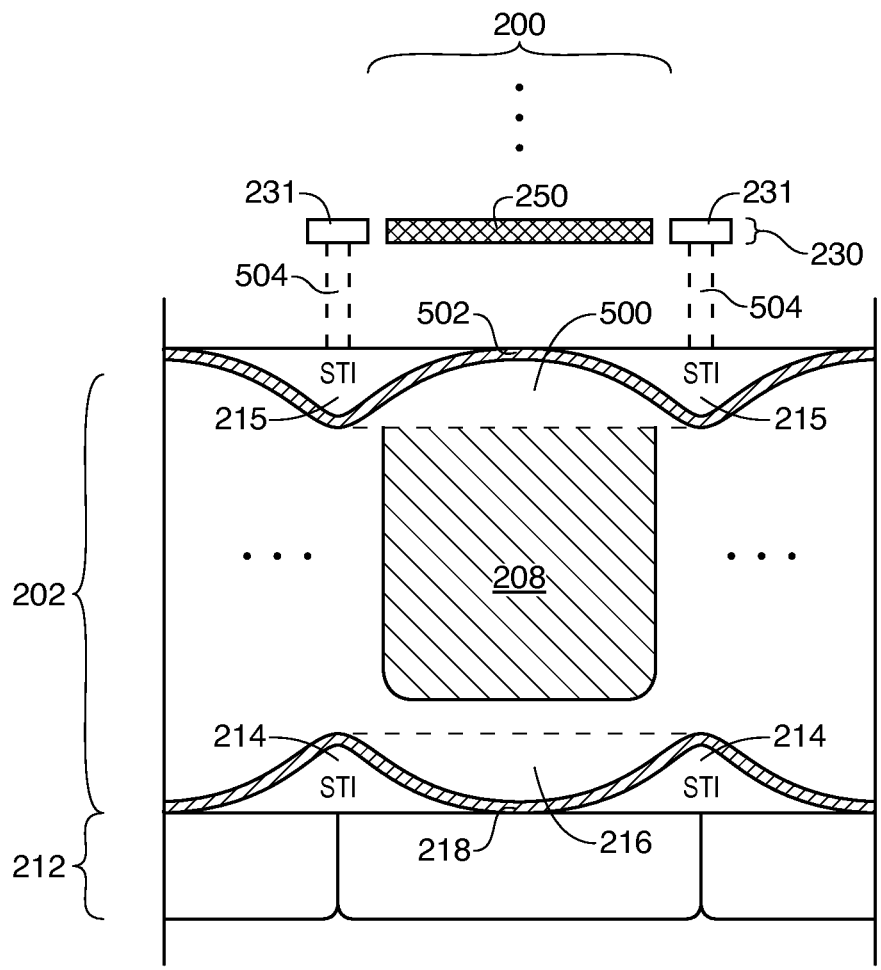
FIG. 6 is a cross-sectional side view of a backside illumination image sensor pixel with a backside silicon focusing microlens and a frontside silicon collimating microlens in accordance with an embodiment of the present invention.

In another suitable arrangement, pixel 200 may include a backside focusing microlens 400 that is formed in the back surface of substrate 202 by forming STI structures 214 and a frontside collimating microlens 500 that is formed in the front surface of substrate 202 by forming STI structures 215 (see, e.g., FIG. 6). A first p+ doped passivation layer may be formed lining built-in silicon microlens 216. Similarly, a second p+ doped passivation layer 502 may be formed lining built-in silicon microlens 500. Liners 218 and 502 may help reduce dark current at the silicon to silicon oxide interface. In the example of FIG. 6, reflective structure 250 is formed on first metal routing layer 230. Metal routing line 231 may be coupled to floating diffusion region 210 via contact 504 (not shown in FIG. 6) and does not form an electrical connection with shallow trench isolation structures 215.

Figure 7:
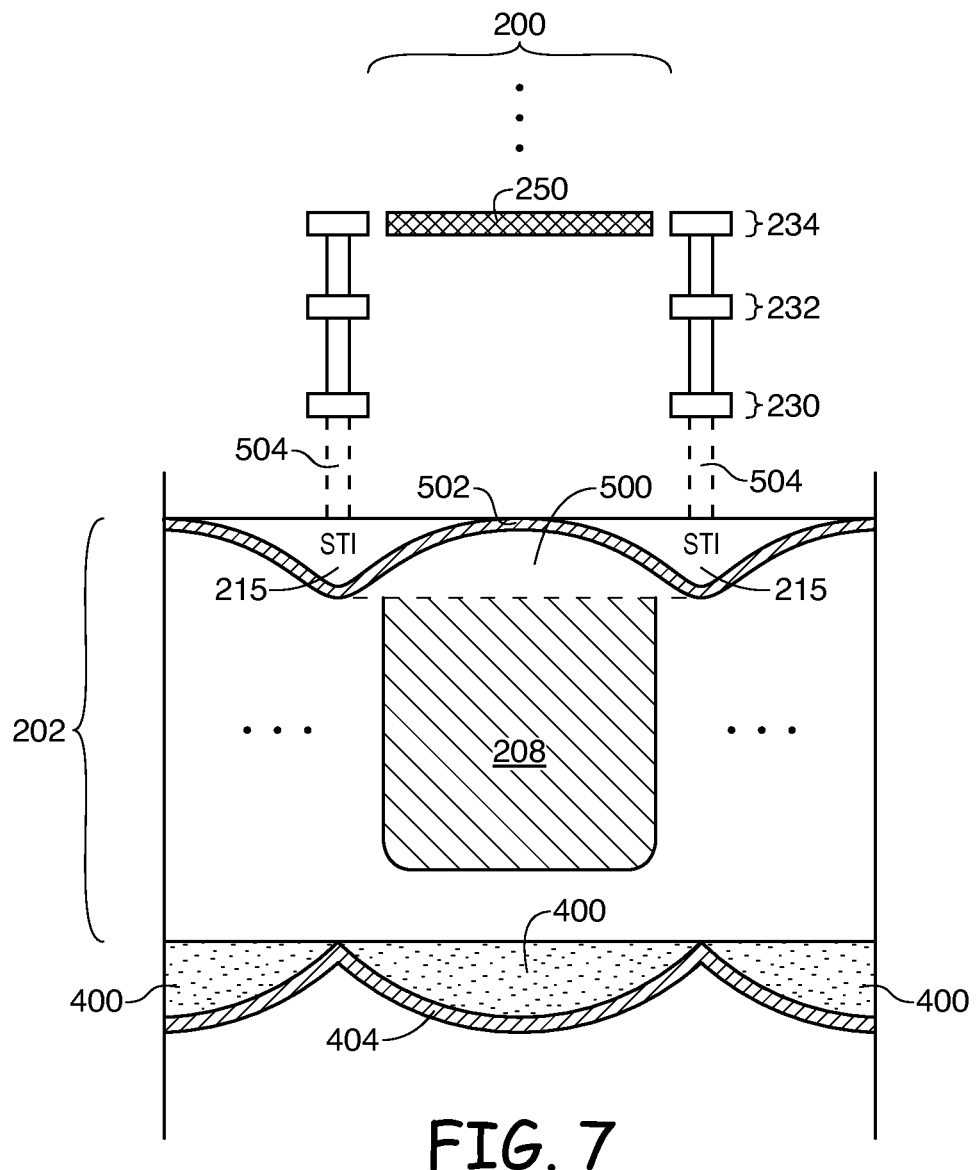
FIG. 7 is a cross-sectional side view of a backside illumination image sensor pixel with a backside polysilicon focusing microlens and a frontside silicon collimating microlens in accordance with an embodiment of the present invention.

In another suitable arrangement, pixel 200 may include a backside focusing microlens 400 that is formed on top of the back surface of substrate 202 using polysilicon and a frontside collimating microlens and a frontside collimating microlens 500 that is formed in the front surface of substrate 202 by forming STI structures 215 (see, e.g., FIG. 7). A passivation layer such as layer 404 may be formed over microlens 400 along its curved surface, whereas passivation layer 502 may line built-in silicon microlens 500. Incoming light may be filtered using a color filter array (not shown) before entering microlens 400. In the example of FIG. 5, reflective structure 250 is formed in the third metal routing layer 234. If desired, a shifted or unshifted polymer microlens (i.e., a microlens with a refractive index of less than 2) may be formed over the backside focusing microlens (i.e., microlens 216 or microlens 400) in each image sensor pixel 200.

Various embodiments have been described illustrating a backside illumination image sensor pixel having microlenses with enhanced refractive indices. The image sensor pixel may include a substrate having a front surface and a back surface, a photodiode formed in the substrate, a first microlens formed at the back surface, a second microlens formed at the front surface, a dielectric stack that contains alternating layers of metal routing layers and conductive via layers formed on the front surface, and a reflective structure formed in a selected metal routing layer in the dielectric stack above the second microlens.

The first and second microlenses may be formed from materials having refractive indices that are greater than 2, greater than 3, greater than 4, etc. In one suitable embodiment, the first microlens may be formed in the back surface of the substrate while the second microlens may be formed on the front surface of the substrate. The first microlens may be integrated with the substrate (e.g., the first microlens and the substrate may be formed from the same semiconductor material) and may be surrounded by associated shallow trench isolation structures formed in the back surface. The second microlens may be a polysilicon microlens that is patterned on the front surface. A color filter may be formed over the first microlens at the back surface. First and second passivation layers (e.g., p+ doped layers) may line the first and second microlenses, respectively, to reduce dark current generation.

In another suitable embodiment, the first microlens may be formed from patterned polysilicon on the back surface of the substrate. In another suitable embodiment, the second microlens may be formed in the front surface of the substrate, may be integrated with the substrate (e.g., the second microlens and the substrate may be formed from identical semiconductor materials), and may be surrounded by associated shallow trench isolation structures formed in the front surface.

Arranged as such, the first microlens may be configured to direct incoming light towards the photodiode. The incoming light may traverse the substrate and may be collimated by the second microlens so that the light exits the second microlens in a direction that is perpendicular to the front surface. The collimated light may be reflected using the reflective structure back towards the photodiode.

The foregoing is merely illustrative of the principles of this invention and various modifications can be made by those skilled in the art without departing from the scope and spirit of the invention. The foregoing embodiments may be implemented individually or in any combination.

What is claimed is:

1. A backside illumination image sensor pixel, comprising:
   a substrate having a front surface and a back surface;
   a photosensitive element formed in the substrate, wherein the photosensitive element is configured to receive incoming light through the back surface;
   shallow trench isolation structures formed in the back surface, wherein the shallow trench isolation structures surround a microlens configured to direct the incoming light towards the photosensitive element; and
   a passivation layer interposed between the microlens and the shallow trench isolation structures.

2. The backside illumination image sensor pixel defined in claim 1, further comprising:
   a color filter formed on the back surface, wherein the incoming light enters the back surface through the color filter, and wherein the color filter comprises a color filter selected from the group consisting of a green filter, a red filter, a blue filter, a yellow filter, a cyan filter, and a magenta filter.

3. The backside illumination image sensor pixel defined in claim 1, further comprising:
   an additional microlens formed on the front surface, wherein the additional microlens is configured to collimate the incoming light that has traversed through the substrate so that the light exits the additional microlens in a direction that is perpendicular to the front surface.

4. The backside illumination image sensor pixel defined in claim 3, further comprising:
   a reflective structure positioned over the additional microlens, wherein the additional microlens is interposed between the reflective structure and the front surface, and wherein the reflective structure is configured to reflect the collimated light back towards the photosensitive element in the substrate.

5. A backside illumination image sensor pixel, comprising:
   a substrate having a front surface and a back surface;
   a photosensitive element formed in the front surface of the substrate, wherein the photosensitive element is configured to receive incoming light through the back surface; and
   a microlens that is formed in the back surface, wherein the microlens is configured to direct the incoming light towards the photosensitive element.

6. The backside illumination image sensor pixel defined in claim 5, wherein the substrate is formed from a given material, and wherein the microlens is formed from the given material.

7. The backside illumination image sensor pixel defined in claim 6, further comprising:
   an additional microlens that is formed in the front surface wherein the additional microlens is formed from the given material.

8. The backside illumination image sensor pixel defined in claim 7, further comprising:
   a first set of shallow trench isolation structures in the back surface that surrounds the microlens; and
   a second set of shallow trench isolation structures in the front surface that surrounds the additional microlens.

9. The backside illumination image sensor pixel defined in claim 7 further comprising:
   a reflective structure formed above the front surface, wherein the reflective structure is configured to reflect light that has traversed through the substrate back towards the photosensitive element in the substrate.

10. A backside illumination image sensor pixel, comprising:
    a substrate having a front surface and a back surface;
    a photosensitive element formed in the front surface of the substrate, wherein the photosensitive element is configured to receive incoming light through the back surface; and
    a microlens that is formed at the back surface, wherein the microlens has a refractive index that is greater than 1.6, wherein the microlens comprises a polysilicon microlens formed on the back surface.

11. The backside illumination image sensor pixel defined in claim 10, further comprising:
    a passivation layer lining the microlens.

12. The backside illumination image sensor pixel defined in claim 10, further comprising:
    an additional polysilicon microlens formed on the front surface; and
    a reflective structure formed above the additional polysilicon microlens, wherein the reflective structure is configured to reflect light that has traversed through the substrate back towards the photosensitive element in the substrate.

13. The backside illumination image sensor pixel defined in claim 10, further comprising:
    an additional microlens formed in the front surface, wherein the substrate and the additional microlens are formed from identical semiconductor material; and
    a reflective structure formed above the additional microlens, wherein the reflective structure is configured to reflect light that has traversed through the substrate back towards the photosensitive element in the substrate.

14. A backside illumination image sensor pixel, comprising:
   a substrate having a front surface and a back surface;
   a photosensitive element formed in the substrate, wherein the photosensitive element is configured to receive incoming light through the back surface; and
   a microlens formed at the front surface of the substrate, wherein the microlens is configured to collimate the incoming light that has traversed through the substrate so that the light exits the microlens in a direction that is perpendicular to the front surface.

15. The backside illumination image sensor pixel defined in claim 14, further comprising:
   a dielectric stack formed on the front surface, wherein the dielectric stack comprises alternating layers of metal routing layers and conductive via layers; and
   a reflective structure formed in a selected one of the metal routing layers in the dielectric stack above the front surface, wherein the reflective structure is configured to reflect light that has traversed through the substrate back towards the photosensitive element in the substrate.

16. The backside illumination image sensor pixel defined in claim 14, wherein the microlens is formed from a material having a refractive index that is greater than 1.6.

17. The backside illumination image sensor pixel defined in claim 14, wherein the microlens comprises a polysilicon microlens formed on the front surface.

18. The backside illumination image sensor pixel defined in claim 14, wherein the microlens is formed in the front surface, wherein the substrate and the microlens are formed from identical semiconductor material, and wherein the microlens is surrounded by associated shallow trench isolation structures.

* * * * *